US012733215B2

(12) United States Patent
Nakano

(10) Patent No.: US 12,733,215 B2
(45) Date of Patent: Sep. 8, 2026

(54) SEMICONDUCTOR DEVICE COMPRISING A FIRST ELECTRODE, A SECOND ELECTRODE, AN INTERLAYER FILM ON THE FIRST ELECTRODE, AND A PROTECTIVE FILM ON THE INTERLAYER FILM; AND SEMICONDUCTOR MODULE COMPRISING THE SEMICONDUCTOR DEVICE

(71) Applicant: Mitsubishi Electric Corporation, Tokyo (JP)

(72) Inventor: Seiya Nakano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 504 days.

(21) Appl. No.: 18/252,606

(22) PCT Filed: Jan. 19, 2021

(86) PCT No.: PCT/JP2021/001636

§ 371 (c)(1),
(2) Date: May 11, 2023

(87) PCT Pub. No.: WO2022/157823

PCT Pub. Date: Jul. 28, 2022

(65) Prior Publication Data

US 2024/0006475 A1 Jan. 4, 2024

(51) Int. Cl.
*H10D 62/10* (2025.01)

(52) U.S. Cl.
CPC .................................. *H10D 62/10* (2025.01)

(58) Field of Classification Search
CPC .... H10D 62/10; H10D 30/668; H10D 30/665; H10D 62/106; H10D 12/411–491;
(Continued)

(56) References Cited

U.S. PATENT DOCUMENTS 12,046,641 B2 * 7/2024 Nagao .................. H10D 12/441
2006/0086939 A1 4/2006 Carta et al.
(Continued)

FOREIGN PATENT DOCUMENTS

JP 2005-019830 A 1/2005
JP 2008-518445 A 5/2008
(Continued)

OTHER PUBLICATIONS

An Office Action; "Notice of Reasons for Refusal," mailed by the Japanese Patent Office on Feb. 27, 2024, which corresponds to Japanese Patent Application No. 2022-576249 and is related to U.S. Appl. No. 18/252,606; with English language translation.
(Continued)

*Primary Examiner* — Shahed Ahmed
(74) *Attorney, Agent, or Firm* — Studebaker Brackett PLLC

(57) ABSTRACT

An object of the present disclosure is to provide a semiconductor device and a semiconductor module in which fluctuations in the characteristics caused by pressure from above are suppressed. A semiconductor device according to the present disclosure includes a semiconductor substrate having a cell portion provided with a semiconductor element and a terminal portion provided around the cell portion in plan view, a first electrode provided on the semiconductor substrate, a second electrode provided at a position corresponding to the cell portion on the first electrode, an interlayer film provided in a position corresponding to the cell portion and the terminal portion on the first electrode, and a protective film provided in a position corresponding to the cell portion and the terminal portion on the interlayer film.

20 Claims, 4 Drawing Sheets

(58) Field of Classification Search
CPC .......... H10D 12/031–038; H10D 62/141–148; H01L 23/3171; H01L 23/5329–53295; H01L 21/76801–76837; H10W 74/137
See application file for complete search history.

(56) References Cited

U.S. PATENT DOCUMENTS

| | | | | |
|---|---|---|---|---|
| 2006/0097267 | A1* | 5/2006 | Kumar | H10D 30/635 257/77 |
| 2008/0286968 | A1 | 11/2008 | Carta et al. | |
| 2022/0059688 | A1 | 2/2022 | Nakata et al. | |

FOREIGN PATENT DOCUMENTS

| | | | |
|---|---|---|---|
| JP | 2019-091731 | A | 6/2019 |
| JP | 2020-013923 | A | 1/2020 |
| WO | 2006/047382 | A2 | 5/2006 |
| WO | 2020/170813 | A1 | 8/2020 |

OTHER PUBLICATIONS

International Search Report issued in PCT/JP2021/001636; mailed Apr. 27, 2021.

* cited by examiner 22
2
11
8
7
10
6
9
3
32
12
31

5
4
13
1

22
2
11
8
7
10
6
9
3
32
42
31
12
5
41
13
1

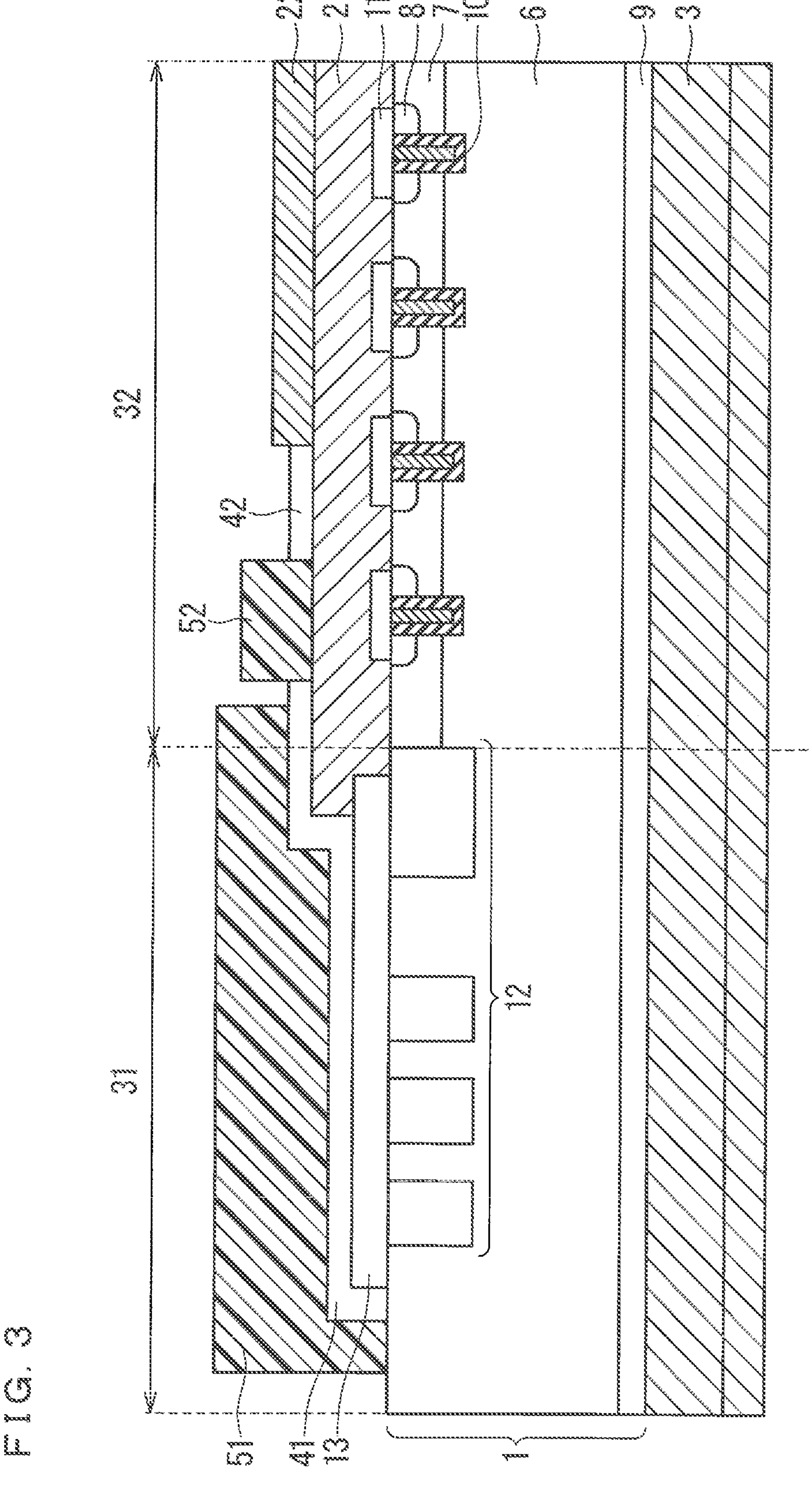
F I G. 3
22
2
11
8
7
10
6
9
3
32
42
52
31
12
51
41
13
1

SEMICONDUCTOR DEVICE COMPRISING A FIRST ELECTRODE, A SECOND ELECTRODE, AN INTERLAYER FILM ON THE FIRST ELECTRODE, AND A PROTECTIVE FILM ON THE INTERLAYER FILM; AND SEMICONDUCTOR MODULE COMPRISING THE SEMICONDUCTOR DEVICE

TECHNICAL FIELD

The present disclosure relates to a semiconductor device and a semiconductor module including the semiconductor device.

BACKGROUND ART

Conventionally, a semiconductor device has been disclosed in which a protective film is provided on a front surface electrode to protect the terminal portion, and a plated electrode is formed by using the protective film as a mask (see Patent Document 1, for example).

PRIOR ART DOCUMENTS

Patent Document(s)

[Patent Document 1] Japanese Patent Application Laid-Open No. 2005-19830

SUMMARY

Problem to be Solved by the Invention

In the semiconductor device disclosed in Patent Document 1, the front surface of the protective film is positioned at the top. Therefore, there has been a problem that, when pressure is applied to the semiconductor device from above when the semiconductor device is pressure-bonded to the module substrate, stress is concentrated on the protective film, causing damage to the internal structure under the protective film and causing fluctuations in the characteristics of the semiconductor device.

The present disclosure has been made to solve such a problem, and an object thereof is to provide a semiconductor device and a semiconductor module in which fluctuations in the characteristics caused by pressure from above are suppressed.

Means to Solve the Problem

A semiconductor device according to the present disclosure includes a semiconductor substrate having a cell portion provided with a semiconductor element and a terminal portion provided around the cell portion in plan view, a first electrode provided on the semiconductor substrate, a second electrode provided at a position corresponding to the cell portion on the first electrode, an interlayer film provided in a position corresponding to the cell portion and the terminal portion on the first electrode, and a protective film provided in a position corresponding to the cell portion and the terminal portion on the interlayer film.

Effects of the Invention

According to the present disclosure, suppression of fluctuations in the characteristics caused by pressure from above.

The objects, features, aspects, and advantages of the present disclosure will become more apparent from the following detailed description and the accompanying drawings.

BRIEF DESCRIPTION OF DRAWINGS

FIG. 3 is a cross-sectional view illustrating a configuration of a semiconductor device according to a third embodiment.

DESCRIPTION OF EMBODIMENT(S)

First Embodiment

Figure 1:
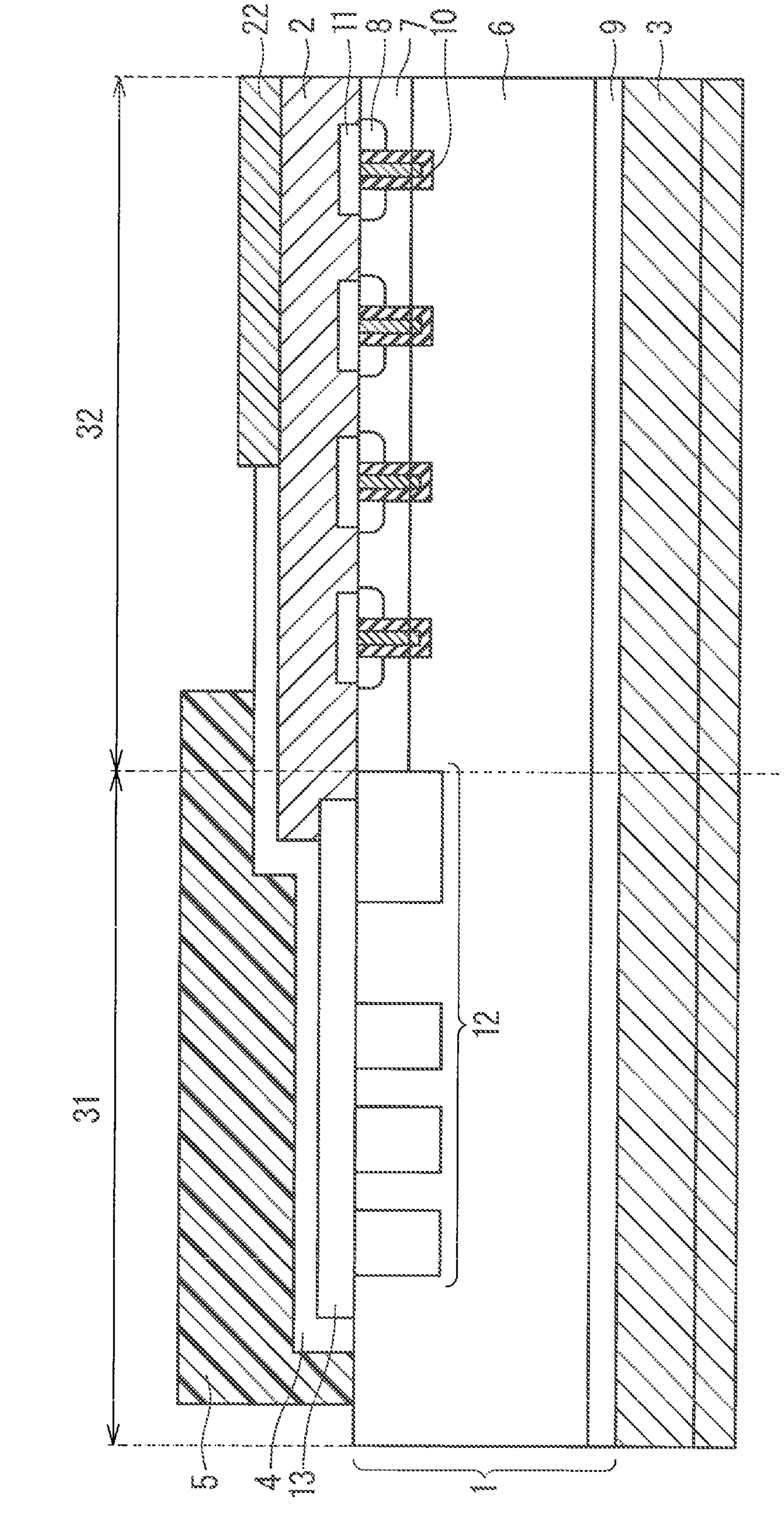
FIG. 1 is a cross-sectional view illustrating a configuration of a semiconductor device according to a first embodiment.

FIG. 1 is a cross-sectional view illustrating a configuration of a semiconductor device according to a first embodiment. Note that FIG. 1 illustrates a configuration of a Metal Oxide Semiconductor Field Effect Transistor (MOSFET) as an example of the semiconductor device.

A semiconductor substrate 1 has a cell portion 32 provided with a MOSFET, which is a semiconductor element, and a terminal portion 31 provided around the cell portion 32 in plan view. The semiconductor substrate 1 is composed of, for example, silicon or silicon carbide.

In the cell portion 32 of the semiconductor substrate 1, an N-type semiconductor region 6, a P-type semiconductor region 7, an N+-type semiconductor region 8, and a backside semiconductor region 9 are formed. Further, trench gates 10 are formed so as to extend from the front surface of the semiconductor substrate 1 through the N+-type semiconductor region 8 and the P-type semiconductor region 7 to reach the N-type semiconductor region 6. That is, the semiconductor element has a trench gate structure.

An oxide film 11 is formed on the front surface of the cell portion 32 of the semiconductor substrate 1 so as to cover part of the N+-type semiconductor region 8 and the trench gate 10.

A front surface electrode 2 (first electrode) is provided on the front surface of the semiconductor substrate 1, and a back surface electrode 3 is provided on the back surface of the semiconductor substrate 1. The front surface electrode 2 is composed of, for example, AlSi or the like. When the semiconductor element is a MOSFET as illustrated in FIG. 1, the front surface electrode 2 functions as a source electrode and the back surface electrode 3 functions as a drain electrode.

A P+-type guard ring region 12 is formed in the terminal portion 31 of the semiconductor substrate 1. The P+-type guard ring region 12 is formed deeper than the P-type semiconductor region 7. A boundary between the terminal portion 31 and the cell portion 32 is a position where the P-type semiconductor region 7 and the P+-type guard ring region 12 are in contact with each other.

An insulating film 13 is formed on the front surface of the terminal portion 31 of the semiconductor substrate 1 so as to cover the P+-type guard ring region 12.

An interlayer film 4 is provided from a position corresponding to the cell portion 32 to a position corresponding to the terminal portion 31 on the front surface electrode 2. In other words, the interlayer film 4 is provided from the terminal portion 31 to the cell portion 32. Further, a projecting portion of the interlayer film 4 forms an opening region for forming an electrode 22. Here, the projection portion of the interlayer film 4 refers to a portion of the interlayer film 4 that is not covered with a protective film 5 (a portion projecting from the protective film 5). The interlayer film 4 is thinner than the protective film 5 and the electrode 22.

The electrode 22 (second electrode) is provided adjacent to the interlayer film 4 at a position corresponding to the cell portion 32 on the front surface electrode 2. The electrode 22 is formed in the opening region of the interlayer film 4 by using the interlayer film 4 as a mask. The steps of the manufacturing process can be reduced by using the interlayer film 4 as a mask when forming the electrode 22.

The protective film 5 is provided on the interlayer film 4 at a position corresponding to the terminal portion 31 and the cell portion 32. In other words, the protective film 5 is provided from the terminal portion 31 to the cell portion 32. The protective film 5 is composed of, for example, polyimide or the like. The protective film 5 is not provided directly above the trench gates 10 and the oxide film 11 in the cell portion 32.

Although FIG. 1 illustrates a semiconductor device in which the semiconductor element is a MOSFET, the semiconductor element may be an Insulated Gate Bipolar Transistor (IGBT). When the semiconductor element is an IGBT, the front surface electrode 2 functions as an emitter electrode, the back surface electrode 3 functions as a drain electrode, and the N+-type semiconductor region 8 is replaced with a P+-type semiconductor region.

Although in the above description, the opening region for forming the electrode 22 is formed in the projection portion of the interlayer film 4, the projection portion may be changed to a film composed of a different material (a film different from the interlayer film 4) on the condition that the film thickness thereof is thinner than that of the protective film 5.

Although FIG. 1 illustrates a known guard ring structure as the structure of the terminal portion 31, any structure other than the guard ring structure may be adoptable as long as the terminal portion 31 includes the interlayer film 4 and the protective film 5. Also, a wiring portion such as gate wiring may be provided between the terminal portion 31 and the cell portion 32.

In the semiconductor device configured as described above, even if pressure is applied from above the semiconductor device and the protective film 5 is stressed, reduction in stress component transmitted to the trench gates 10 and the oxide film 11 formed in the cell section 32 through the front surface electrode 2 is ensured more than before. Therefore, fluctuations in the characteristics such as gate defects and breakdown voltage defects caused by pressure from above are suppressed.

As known, the interlayer film 4 and the protective film 5 are provided for the purpose of stress relaxation and electrical protection in the terminal portion 31. In the semiconductor device configured as described above, the interlayer film 4 and the protective film 5 provided to protect the terminal portion 31 are extended to the cell portion 32, thereby achieving the above effects without adding a manufacturing steps.

Second Embodiment

Figure 2:
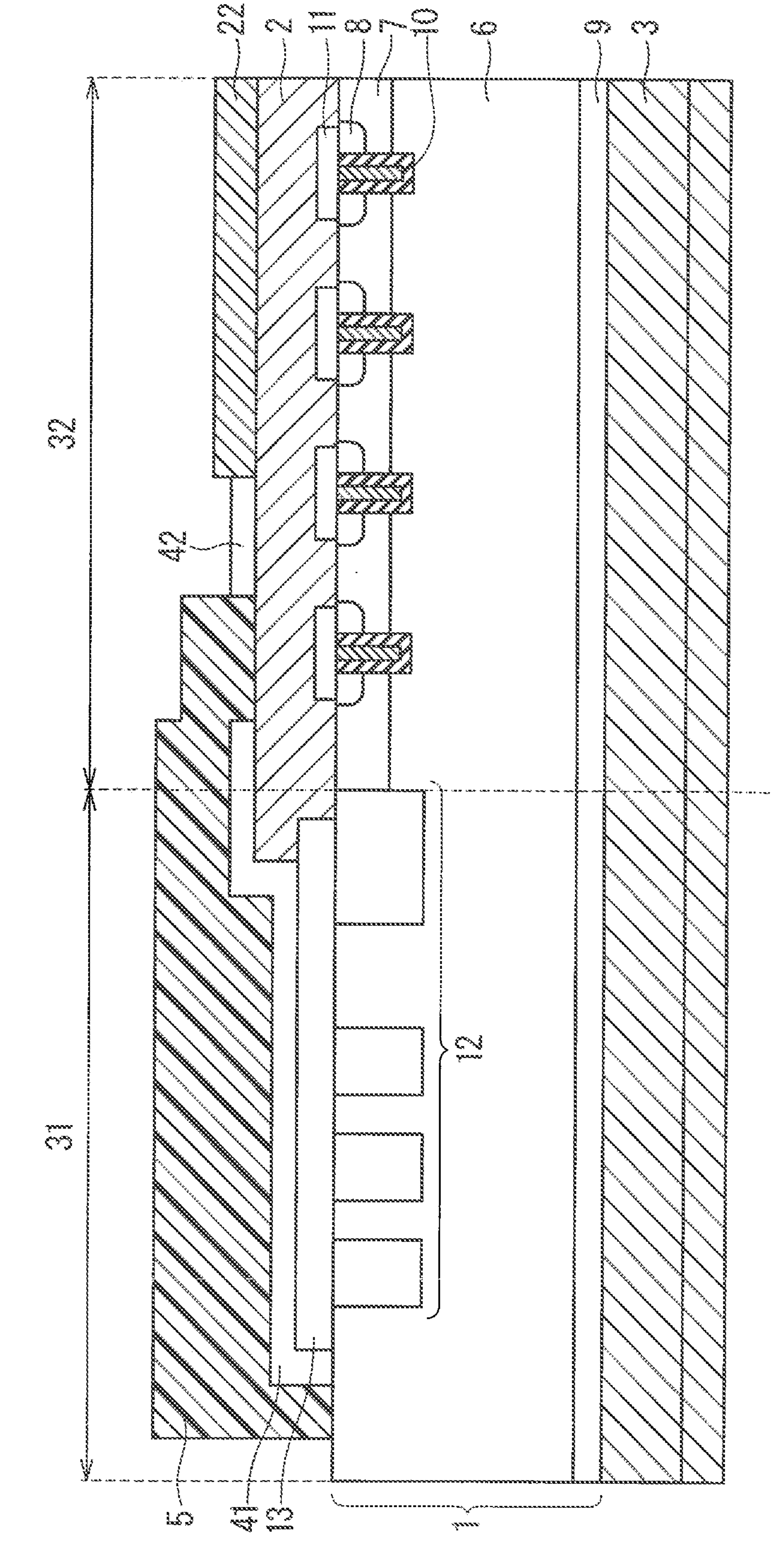
FIG. 2 is a cross-sectional view illustrating a configuration of a semiconductor device according to a second embodiment.

FIG. 2 is a cross-sectional view illustrating a configuration of a semiconductor device according to a second embodiment. As illustrated in FIG. 2, the second embodiment is characterized in that an interlayer film 41 and an interlayer film 42 are provided apart from each other. Other configurations are the same as the first embodiment, and description thereof is omitted here.

The interlayer film 41 (second interlayer film) is provided from a position corresponding to the cell portion 32 to a position corresponding to the terminal portion 31 on the surface electrode 2. The interlayer film 42 (first interlayer film) is provided at a position corresponding to only the cell portion 32 on the surface electrode 2. The interlayer film 42 forms an opening region for forming the electrode 22. The interlayer films 41 and 42 are thinner than the protective film 5.

A spaced portion is provided between the interlayer film 41 and the interlayer film 42. The protective film 5 is provided from over the interlayer film 41 to the spaced portion between the interlayer film 41 and the interlayer film 42. Specifically, the protective film 5 is provided so as to fill the spaced portion so as not for the electrode 22 to be formed in the spaced portion between the interlayer film 41 and the interlayer film 42.

Although the interlayer films 41 and 42 may be formed of the same material, the interlayer film 42 may be changed to a film composed of a different material (a film different from the interlayer film 41) on the condition that the film thickness thereof is thinner than that of the protective film 5.

When a glass coat is adopted for the interlayer films 41 and 42 and the interlayer films 41 and 42 are formed by plasma Chemical Vapor Deposition (CVD), due to hydrogen ions present in the interlayer films 41 and 42 in large number, the hydrogen ions move from the interlayer films 41 and 42 to the oxide film 11 via the front surface electrode 2. This may increase the interface charge density Qss and change characteristics such as the gate threshold voltage. With respect to this, in the semiconductor device according to the second embodiment, the area covered by the interlayer films 41 and 42 on the front surface electrode 2 is reduced, so that the fluctuations in the characteristics can be reduced. Also, the same effects as in the first embodiment can be obtained.

Third Embodiment

FIG. 3 is a cross-sectional view illustrating a configuration of a semiconductor device according to a third embodiment. As illustrated in FIG. 3, the third embodiment is characterized in that a protective film 51 and a protective film 52 are provided apart from each other. Other configurations are the same as the second embodiment, and description thereof is omitted here.

The protective film 51 (first protective film) is provided over the interlayer film 41. The protective film 52 (second protective film) is provided on the surface electrode 2 in the spaced portion and between the interlayer film 41 and the interlayer film 42. Specifically, the protective film 52 is provided so as to fill the spaced portion so as not for the electrode 22 to be formed in the spaced portion between the interlayer film 41 and the interlayer film 42. The protective film 51 and the protective film 52 are apart from each other.

Although the protective films 51 and 52 may be formed of the same material, the protective film 52 may be changed to a film composed of a different material (a film different from the protective film 51). Further, if the electrode 22 is allowed to be formed in the spaced portion between the interlayer film 41 and the interlayer film 42, the protective film 52 may not be provided.

The semiconductor device according to the third embodiment, the protective film 51 and the protective film 52 are provided apart from each other. Therefore, since there is room for the protective films 51 and 52 to deform between the protective film 51 and the protective film 52, even if the protective films 51 and 52 receive stress from pressure applied from above the semiconductor device, the stress tends to be relaxed, thereby, suppressing fluctuations in the characteristics such as gate defects and breakdown voltage defects more effectively than in the second embodiment.

Fourth Embodiment

Figure 4:
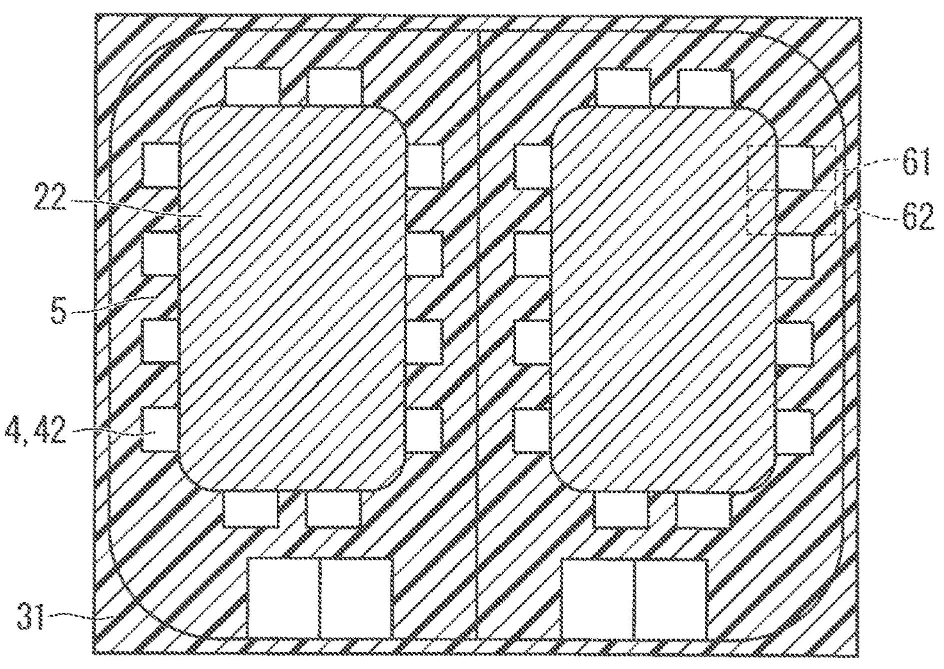
FIG. 4 is a plan view illustrating a configuration of a semiconductor device according to a fourth embodiment.

FIG. 4 is a plan view illustrating a configuration of a semiconductor device according to a fourth embodiment.

As illustrated in FIG. 4, in the fourth embodiment, regions 61 formed with the structure of any one of the first to third embodiments (see FIGS. 1 to 3) and regions 62 formed with the conventional structure are alternately formed and arranged. Here, the conventional structure refers to a structure in which a protective film is used as a mask to form an electrode (corresponding to the electrode 22 of the present disclosure), such as the semiconductor device disclosed in Patent Document 1, for example.

In the region 61, the interlayer film 4 described in the first embodiment (see FIG. 1) or the interlayer film 42 described in the second and third embodiments (see FIGS. 2 and 3) is adjacent to electrode 22. Also, the protective film 5 is adjacent to the electrode 22 in the region 62. The interlayer films 4, 42 and the protective films 5 are alternately arranged.

With the configuration as described above, fluctuations in the characteristics can be suppressed more than in the second and third embodiments.

Fifth Embodiment

Figure 5:
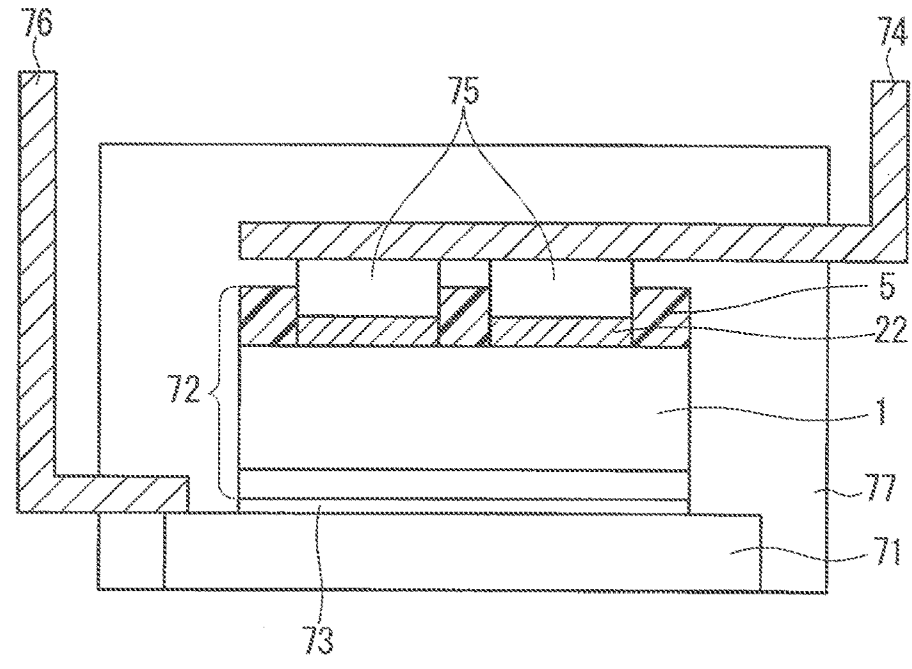
FIG. 5 is a cross-sectional view illustrating a configuration of a semiconductor module according to a fifth embodiment.

FIG. 5 is a cross-sectional view illustrating a configuration of a semiconductor module according to a fifth embodiment.

The semiconductor module includes a module substrate 71, a semiconductor device 72, lead members 74 and 76 and a mold resin 77. The semiconductor device 72 corresponds to any one of the semiconductor devices described in the first to fourth embodiments. The semiconductor device 72 is mounted on the module substrate 71 by pressure bonding via a bonding material 73 such as solder. The lead member 74 is electrically connected to the electrode 22 via a bonding material 75 such as solder. The lead member 76 is electrically connected with the module substrate 71. The mold resin 77 seals the semiconductor device 72 so that the lead members 74 and 76 partially project.

With the configuration as described above, fluctuations in the characteristics such as gate defects and breakdown voltage defects are suppressed.

It should be noted that the embodiments of the present disclosure can be arbitrarily combined and can be appropriately modified or omitted without departing from the scope of the invention.

While the present disclosure has been described in detail, the forgoing description is in all aspects illustrative and not restrictive. It is therefore understood that numerous undescribed modifications and variations can be devised.

EXPLANATION OF REFERENCE SIGNS

1 semiconductor substrate, 2 front surface electrode, 3 back surface electrode, 4 interlayer film, 5 protective film, 6 N-type semiconductor region, 7 P-type semiconductor region, 8 N+-type semiconductor region, 9 back surface side semiconductor region, 10 trench gate, 11 oxide film, 12 P+-type guard ring region, 13 insulating film, 22 electrode, 31 terminal portion, 32 cell portion, 41, 42 interlayer film, 51, 52 protection film, 61, 62 region, 71 module substrate, 72 semiconductor device, 73 bonding material, 74 lead member, 75 bonding material, 76 lead member, 77 mold resin.

The invention claimed is:

1. A semiconductor device comprising:

a semiconductor substrate having a cell portion provided with a semiconductor element and a terminal portion provided around the cell portion in plan view;

a first electrode provided on the semiconductor substrate;

a second electrode provided at a position corresponding to the cell portion on the first electrode;

an interlayer film provided in a position corresponding to the cell portion and the terminal portion on the first electrode; and a protective film provided in a position corresponding to the cell portion and the terminal portion on the interlayer film, wherein a side surface of the interlayer film faces a side surface of the second electrode, and among all surfaces of the interlayer film, only the side surface of the interlayer film faces the second electrode.

2. The semiconductor device according to claim 1, wherein the interlayer film is provided from a position corresponding to the cell portion to a position corresponding to the terminal portion.

3. The semiconductor device according to claim 1, wherein the interlayer film includes a first interlayer film provided at a position corresponding to only the cell portion, and a second interlayer film provided from a position corresponding to the cell portion to a position corresponding to the terminal portion, and a spaced portion is provided between the first interlayer film and the second interlayer film.

4. The semiconductor device according to claim 3, wherein the protective film is provided from over the second interlayer film to the spaced portion over the first electrode.

5. The semiconductor device according to claim 3, wherein the protective film includes a first protective film provided over the second interlayer film and a second protective film provided in the spaced portion over the first electrode, and the first protective film and the second protective film are apart from each other.

6. The semiconductor device according to claim 1, wherein the interlayer film and the protective film are arranged adjacent to the second electrode and alternately with each other in plan view.

7. The semiconductor device according to claim 1, wherein the interlayer film is thinner than the protective film.

8. The semiconductor device according to claim 1, wherein the semiconductor element has a trench gate structure.

9. A semiconductor module comprising:

a module substrate;

the semiconductor device according to claim 1 pressure-bonded on the module substrate; and a mold resin sealing the semiconductor device.

10. The semiconductor device according to claim 1, wherein the first electrode is provided on the semiconductor substrate in a position corresponding to the cell portion and the terminal portion.

11. The semiconductor device according to claim 1, wherein the first electrode is directly electrically connected to the semiconductor substrate, the interlayer film directly contacts the first electrode, and the protective film is spaced from the second electrode.

12. The semiconductor device according to claim 11, wherein the protective film directly contacts the first electrode.

13. The semiconductor device according to claim 1, wherein the protective film directly contacts the first electrode.

14. The semiconductor device according to claim 1, wherein the interlayer film directly contacts the second electrode.

15. The semiconductor device according to claim 1, wherein the protective film extends continuously from the terminal portion to the cell portion and thereby overlaps the first electrode.

16. The semiconductor device according to claim 1, wherein an uppermost surface of the interlayer film is below an upper surface of the second electrode.

17. The semiconductor device according to claim 1, wherein the interlayer film includes a first interlayer film provided at a position corresponding to only the cell portion, and a second interlayer film provided from a position corresponding to the cell portion to a position corresponding to the terminal portion, and a spaced portion is provided between the first interlayer film and the second interlayer film, and the first interlayer film and the second interlayer film are positioned on the first electrode.

18. The semiconductor device according to claim 1, wherein the interlayer film includes a first interlayer film provided at a position corresponding to only the cell portion, and a second interlayer film provided from a position corresponding to the cell portion to a position corresponding to the terminal portion, and a spaced portion is provided between the first interlayer film and the second interlayer film, and the first interlayer film and the second interlayer film directly contact the first electrode.

19. The semiconductor device according to claim 1, wherein a thickest part of the interlayer film is thinner than the protective film.

20. A semiconductor device comprising:

a semiconductor substrate having a cell portion provided with a semiconductor element and a terminal portion provided around the cell portion in plan view;

a first electrode provided on the semiconductor substrate;

a second electrode provided at a position corresponding to the cell portion on the first electrode;

an interlayer film provided in a position corresponding to the cell portion and the terminal portion on the first electrode; and a protective film provided in a position corresponding to the cell portion and the terminal portion on the interlayer film, wherein the interlayer film includes a first interlayer film provided at a position corresponding to only the cell portion, and a second interlayer film provided from a position corresponding to the cell portion to a position corresponding to the terminal portion, a spaced portion is provided between the first interlayer film and the second interlayer film, and the protective film is provided from over the second interlayer film to the spaced portion over the first electrode.

* * * * *